United States Patent [19]
Habel et al.

[11] Patent Number: 5,579,328
[45] Date of Patent: Nov. 26, 1996

[54] DIGITAL CONTROL OF LASER DIODE POWER LEVELS

[75] Inventors: Richard A. Habel, Ottawa; Kim B. Roberts, Kanata, both of Canada

[73] Assignee: Northern Telecom Limited, Montreal, Canada

[21] Appl. No.: 513,280

[22] Filed: Aug. 10, 1995

[51] Int. Cl.$^6$ ....................... H01S 3/13
[52] U.S. Cl. ............... 372/31; 372/38; 372/28; 372/32
[58] Field of Search ............... 372/31, 38, 33, 372/28, 32, 26, 29

[56] References Cited

U.S. PATENT DOCUMENTS

| | | | |
|---|---|---|---|
| 4,347,610 | 8/1982 | Meuleman | 372/29 |
| 4,504,976 | 3/1985 | Beaudet | 455/611 |
| 4,698,817 | 10/1987 | Burley | 372/31 |
| 4,733,398 | 3/1988 | Shibagaki et al. | 372/31 |
| 4,896,325 | 1/1990 | Coldren | 372/31 |
| 4,995,045 | 2/1991 | Burley et al. | 372/38 |
| 5,325,382 | 6/1994 | Emura et al. | 372/26 |
| 5,349,598 | 9/1994 | Ouchi et al. | 372/26 |
| 5,371,755 | 12/1994 | Murata et al. | 372/38 |
| 5,506,853 | 4/1996 | Tegge | 372/29 |

FOREIGN PATENT DOCUMENTS

2025121 5/1982 United Kingdom.

OTHER PUBLICATIONS

"Laser Level Control for High Bit Rate Optical Fibre Systems", Smith et al, 13th Circuits and Systems International Symposium, Houston, Texas, Apr. 1980.

*Primary Examiner*—Leon Scott, Jr.
*Attorney, Agent, or Firm*—George MacGregor

[57] ABSTRACT

A digital controller for an injection laser diode. The controller maintains the laser diode average and peak power levels constant in spite of temperature and/or aging effects. A pseudo-random sequence is superimposed on the '0' and/or '1' current levels to the laser diode and the optical output is detected by a back facet monitor. The detected signal is compared with preset references and a feedback signal is used to control both the bias current and the modulation current.

8 Claims, 10 Drawing Sheets ns5,579,328

DIGITAL CONTROL OF LASER DIODE POWER LEVELS

FIELD OF THE INVENTION

This invention relates to a laser diode controller and more particularly to a digital controller which maintains the laser diode average and peak power levels constant in spite of temperature and/or aging effects.

BACKGROUND OF THE INVENTION

Injection laser diodes are employed extensively in optical transmission systems as the emission wavelength range of device fabricated in certain III-V alloy systems falls within the low dispersion/absorption window of single mode optical fibers. Such devices are, however, subject to output power variations as a function of operating temperature and aging conditions. Accordingly, it is important that the input power to laser diodes be controlled so as to accommodate these potential variations.

It is known that the output power of an injection laser diode as a function of injection current has two distinct regions. Below threshold the output increases relatively slowly with increasing current whereas above threshold the output power increases rapidly and substantially linearly with current. The slope of the light-current characteristic above threshold is a measure of the device efficiency. Both threshold and device efficiency are subject to variation with temperature and aging. Hence, it is important in systems employing diode lasers to have controllers which can compensate for such temperature and aging effects.

PRIOR ART

The prior art discloses methods of controlling the input power to injection lasers using feedback loops. In these methods back facet monitors (photodiodes) detect the laser output and this output is used to provide feedback data for use in the controller. Smith and Hodgkinson, "Laser Level Control for High Bit Rate Optical Fibre Systems", presented at 13th Circuits and Systems International Symposium, Houston, April 1980, relates to such a control system wherein a low frequency signal is superimposed on the dc bias current and pulse current to the laser. A low frequency signal in the form of a 1 kHz square wave having a peak to peak swing of 1% of the nominal pulse current is superimposed on the '0' level of the data signal. The output of this laser is detected by a feedback photodiode and the output is extracted by a phase sensitive detector. This output is compared with a reference voltage and used to set the peak to peak pulse current. A second feedback loop controls the mean power and hence the '1' level output by control of the dc bias current. In this system the 1 kHz square wave in a first embodiment is applied to the bias current. In a second embodiment the square wave is applied to the '0' level while in a third the modulation current is modulated with the low frequency signal.

In U.S. Pat. No. 4,995,045, issued Feb. 19, 1991 to Burley et al, a 5 kHz tone signal is supplied to an amplifier which controls the bias current to a laser diode. A second control loop responsive to the output of the amplifier is used to control the modulation current to the laser. The control loops are operative to adaptively maintain the output of the laser diode in spite of changes in the characteristic curve due to aging or temperature changes.

SUMMARY OF THE INVENTION

The present invention seeks to provide an improved apparatus for digitally controlling the average and peak power levels of a laser diode in spite of temperature and/or aging effects.

The controller includes a common platform having means to provide the aforementioned control to lasers having different characteristics such as devices having non-linearity around the logic '1' power level, devices that need to be biased well above threshold and combinations thereof. The circuit of the invention allows for this range of different laser requirements by changing only the firmware of the microprocessor based power controller.

Therefore in accordance with a first aspect of the invention there is provided an apparatus for controlling the average and peak optical power of an injection laser. The apparatus comprises a first drive means for applying a bias current to the laser and second device means for applying a modulation current to the laser so as to modulate its optical output in accordance therewith. A third drive means applies a low frequency pseudo-random sequence to the modulation current. A detector senses the optical output of the laser and provides a corresponding output signal. Comparator means digitally compares the output signal with a reference signal and provides a feedback signal to the first drive means to control the average optical power and to the second drive means to control the peak optical power.

BRIEF DESCRIPTION OF THE DRAWING

The invention will now be described in detail with reference to the attached drawings wherein.

DETAILED DESCRIPTION OF THE INVENTION

Figure 1:
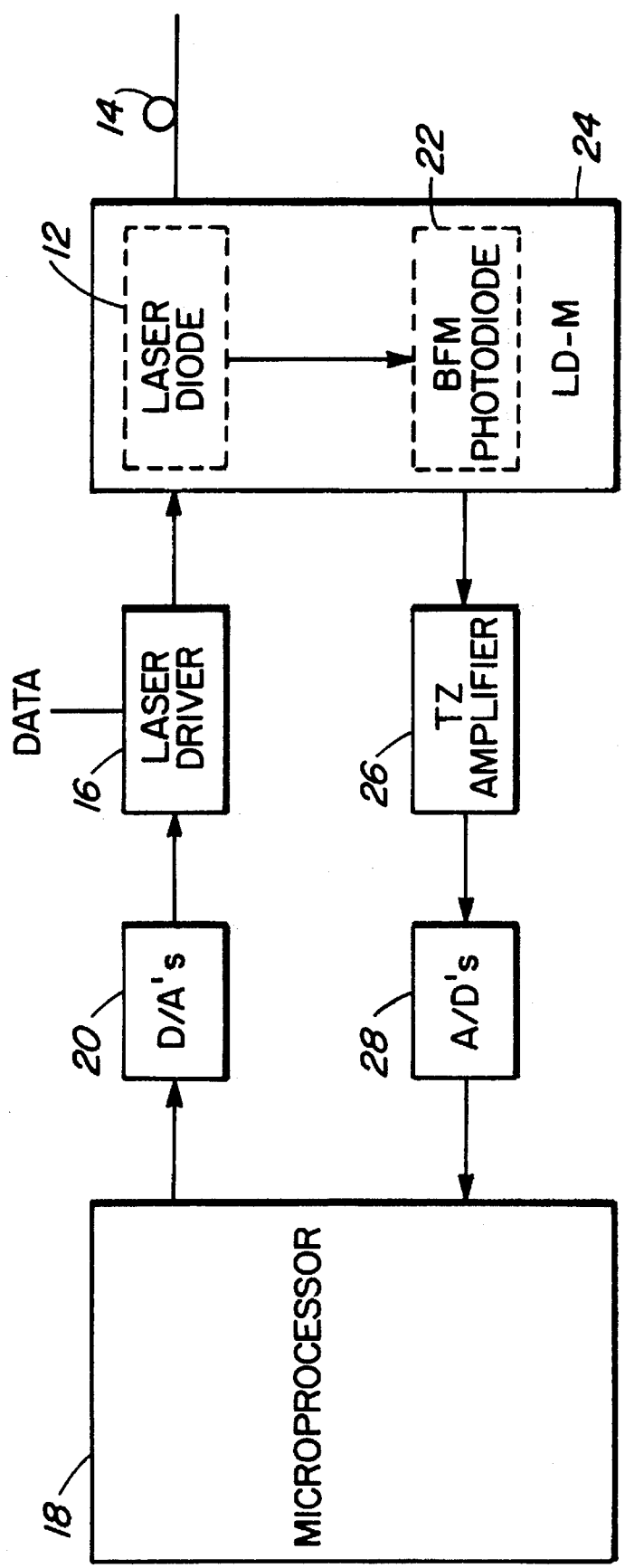
FIG. 1 is a simplified block diagram of the microprocessor based laser power control system of the present invention.

FIG. 1 is a simplified block diagram of the microprocessor based laser power control system of the present invention. A digital system as described herein requires fewer components than its analog counterpart and can be programmed to carry out tasks in sequence. There is therefore the potential for lower cost and the controller spare capacity can be used to monitor the system and adapt the control parameters and/or structure in order to maintain optimal performance. With large quantity applications, integration of analog interface onto custom silicon is straightforward and a two-chip solution using digital control is advantageous.

As shown in FIG. 1, laser diode 12 is used to transmit optical data on fiber 14. Data is supplied to laser diode 12 via laser driver 16 which is provided with a bias current and modulation current from the microprocessor 18 via the digital to analog converter 20. A back facet monitor in the form of a photodiode 22 is associated with laser 12 and is part of the laser module 24. In this configuration, laser 12 is of the Fabry-Perot type having a facet at each end of the resonator cavity. The output from the front facet serves as the transmitter source while the back facet output, which is proportional to the front facet output, is detected by the monitor 22. The output detected by monitor 22 is, therefore, representative of the laser output. Photodiode 22 converts the optical signal from laser 12 into a corresponding electrical signal which is amplified by transimpedance amplifier 26. The amplified analog signal is converted to a digital signal by analog to digital converter 28. Microprocessor 18 compares the laser diode average and peak optical output levels detected through photodiode 22 with corresponding preset references. The results of these comparisons are used by the microprocessor to increase or decrease the average and peak power levels. The microprocessor in this manner can be programmed to control a wide range of different laser requirements simply by changing the firmware.

Figure 2A:
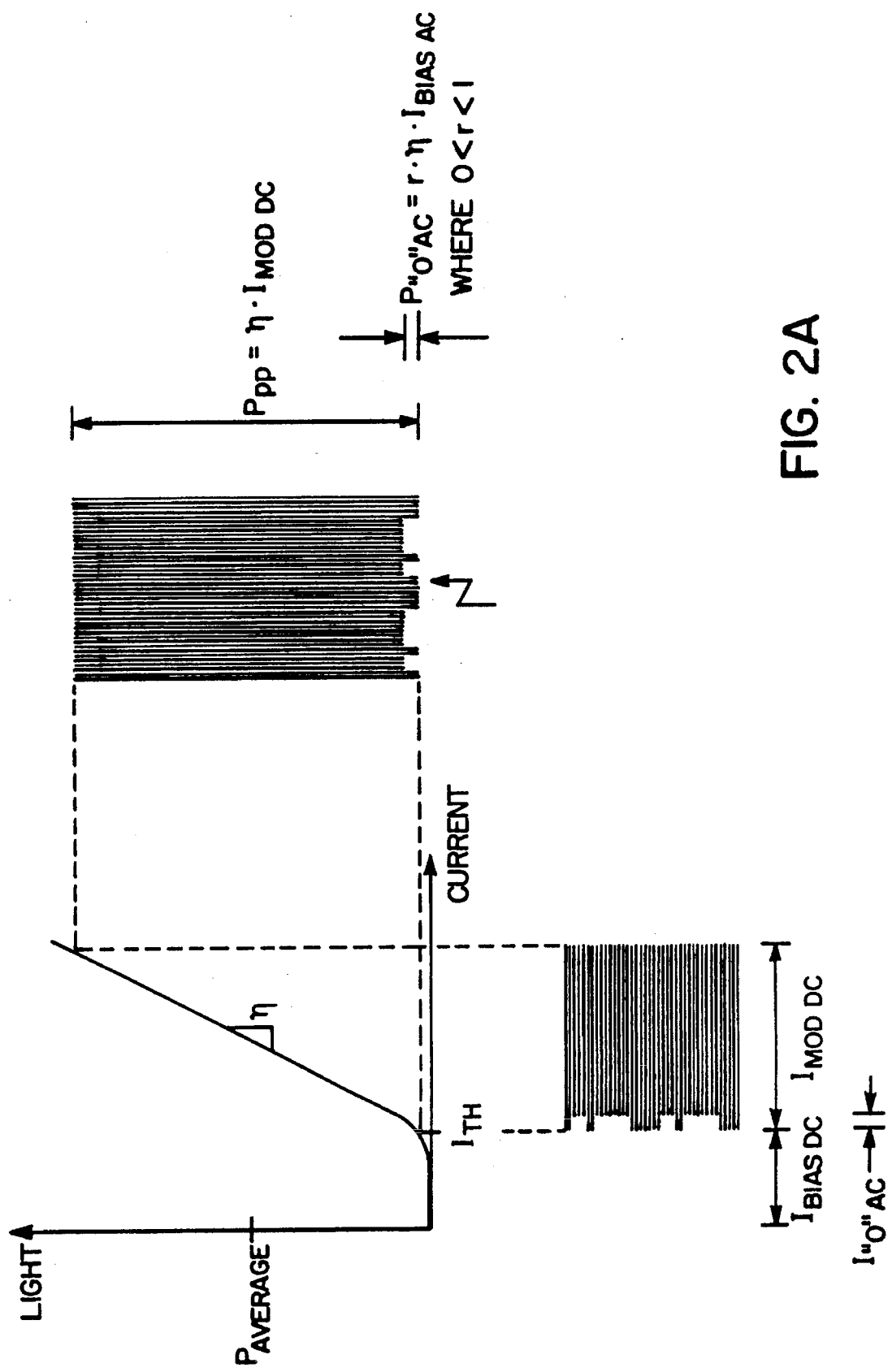
FIG. 2A is a light-current characteristic curve of a laser diode with '0' level modulation according to a first embodiment of the invention.

The manner in which this is accomplished will now be described in greater detail. FIG. 2A shows the light vs. injection current characteristic for a typical injection laser. Below threshold, $I_{th}$, light generated by the device is spontaneous and is of relatively low intensity. Above threshold, optical output power increases rapidly and substantially linearly with increasing current. Thus modulation current to the device having components above and below threshold will result in a distorted output. For this reason, and in particular in high speed applications, it is common to provide a bias current to the device, the bias current being close to or at threshold. The modulation current is then supplied on top of the bias current so that modulation occurs only in the linear portion of the light/current curve. The slope η of the linear portion of the curve is referred to as the laser diode efficiency. Both $I_{th}$ and η are subject to variations with both temperature and time. The controller of this invention compensates for these variations by adjusting drive conditions in response to feedback information from the back facet monitor.

In accordance with a first embodiment of the invention a small amplitude, low bit rate pseudo-random sequence is superimposed on the '0' current level of the data signal. By way of clarification the '0' current level of the data signal is the input current level for which there is no significant optical output, i.e., at or about the threshold level. The '1' level referred to later is the current level at which the full laser output is achieved. The bit rate of the pseudo-random sequence is low compared to the bit rate of the modulating current. In a preferred embodiment the bit rate of the sequence is 1 Kb/s. This is shown in FIG. 2A. The pseudo-random sequence, shown as $I_{\cdot 0 \cdot ac}$, is small in relation to the modulation current $I_{mod\ dc}$. In a practical sense the sequence may be 1% of the room temperature/start of life (RT/SOL) amplitude of $I_{mod\ dc}$. The sequence supplied to the laser results in an output power sequence $P_{\cdot 0 \cdot ac}$ which is equal to the input sequence times the slope η times a factor r where r is greater than 0 and less than 1. The peak-to-peak power $P_{pp}$ is the product of the modulation current and the slope, η.

Figure 2B:
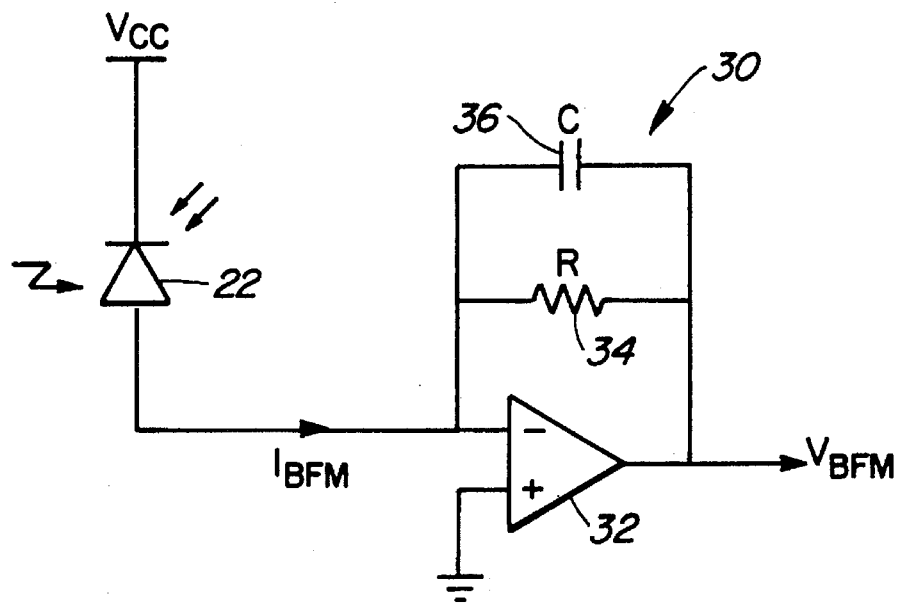
FIG. 2B is a circuit diagram of the back facet monitor and associated transimpedance amplifier.
Figure 2C:
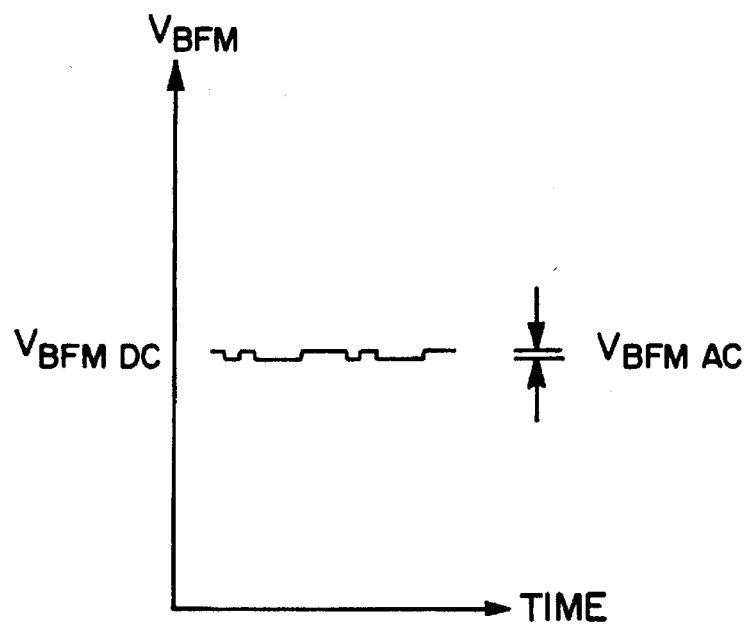
FIG. 2C is the voltage waveform from the transimpedance amplifier of FIG. 2B.

A laser power control algorithm in the microprocessor controls the average and peak power through a feedback mechanism. The photodiode 22 as shown in FIG. 2B monitors the back facet of the laser diode (not shown) and generates photocurrent $I_{BFM}$ which is related to the output power sequence from the laser. The monitoring photodiode is buffered by a transimpedance amplifier 30 comprising amplifier 32 with feedback resistor 34 and capacitor 36. The RC value of resistor 34 and capacitor 36 is much greater than the bit period of the data train and much less than the bit period of the pseudo random sequence. The amplifier output signal $V_{BFM}$ is used to adjust the laser bias current $I_{bias\ dc}$ and the laser modulation current $I_{mod\ dc}$. The bandwidth of the detector and the circuitry for this implementation are not critical. The monitor signal $V_{BFM\ ac}$ is shown in FIG. 2C.

The power control algorithm uses a double feedback loop that extracts the average power, $P_{average}$, and the 'off' light level, $P_{\cdot 0 \cdot}$. The transimpedance amplifier dc output voltage $V_{BFM\ dc}$ controls $I_{bias\ dc}$ and hence $P_{average}$ via the firmware, The quantity $P_{\cdot 0 \cdot}$ is extracted using a slope detector that takes advantage of the high degree of non-linearity of the light-current characteristic of the laser. The photodiode signal corresponding to the pseudo-random sequence diode input is detected with a digital correlator to eliminate data traffic noise contributions. The correlator output COR is then compared with a reference and is used to set the modulation current $I_{mod\ dc}$.

The double feedback strategy maintains the biasing point at $$\frac{I_{bias\ dc}}{I_{th}} \sim 1$$

and hence can easily track the time and temperature change of $I_{th}$ and η.

Figure 3:
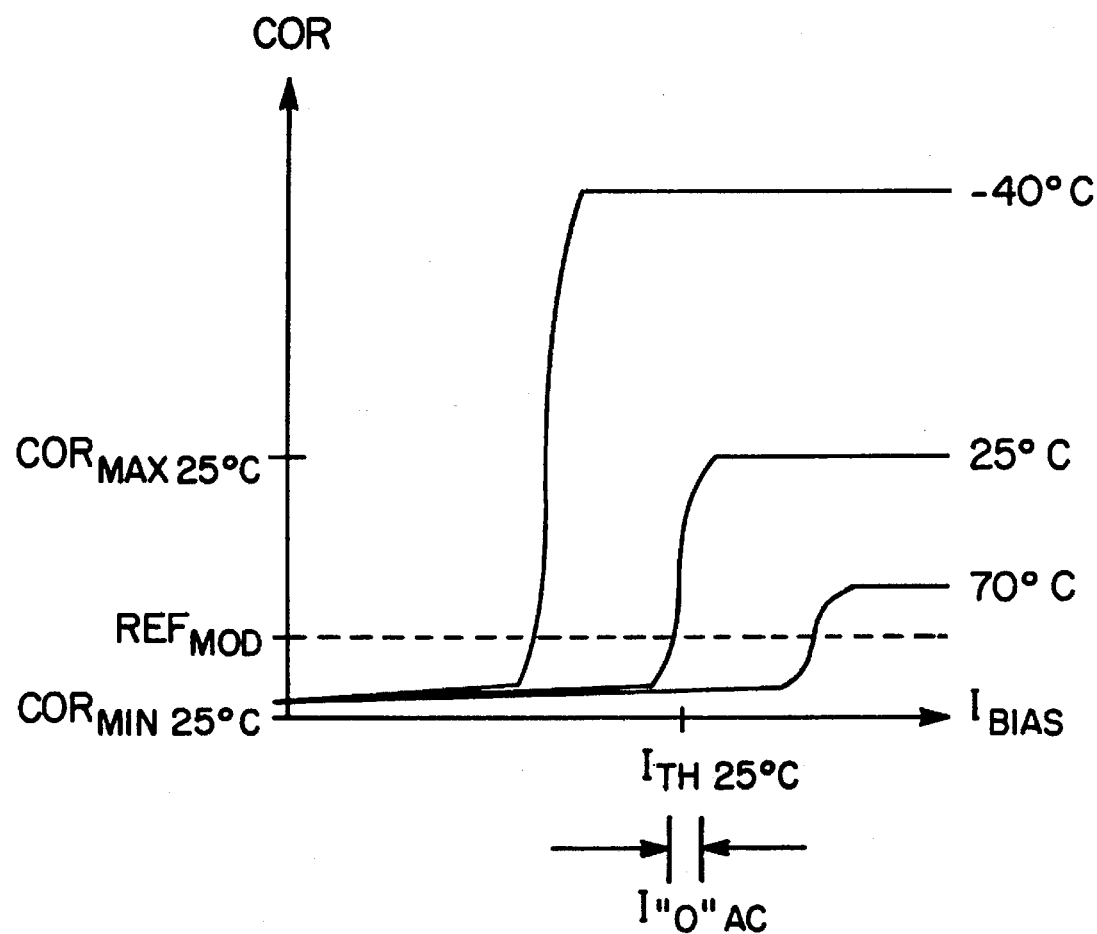
FIG. 3 is a graph showing the correlator transfer function for temperatures of −40° C., 25° C. and 70° C.

FIG. 3 shows that the correlator output is, at a given instant and temperature, constant and proportional to η if the laser diode is modulated well above threshold. When the laser is operated well below threshold the correlator output is close to zero and would be exactly zero if the laser driver resistors and transistors were perfectly matched, and if there was no spontaneous noise.

The amplitude of the low bit rate pseudo-random sequence applied to the '0' current level is, ideally, kept constant during the lifetime of the laser module.

The reference of the modulation current control loop, $REF_{mod}$, could be chosen during the factory setup procedure, i.e., RT/SOL such that the laser diode slope around the '0' power level is approximately $$\frac{\eta_{RT/SOL}}{4},$$

i.e., $$REF_{mod} = COR_{min\,25°} + \frac{COR_{max\,25°} - COR_{min\,25°}}{4}.$$

In order to reduce the risk of correlation (i.e., interference) between the '0' level modulation signal and the data traffic, a long pseudo-random sequence (e.g., $2^5$ bit) can be chosen instead of a short sequence or a single frequency tone.

The algorithm of this embodiment is simple to program and is particularly advantageous for laser diodes which exhibit non-linearity around the '1' power level since it senses the laser threshold only.

Figure 4A:
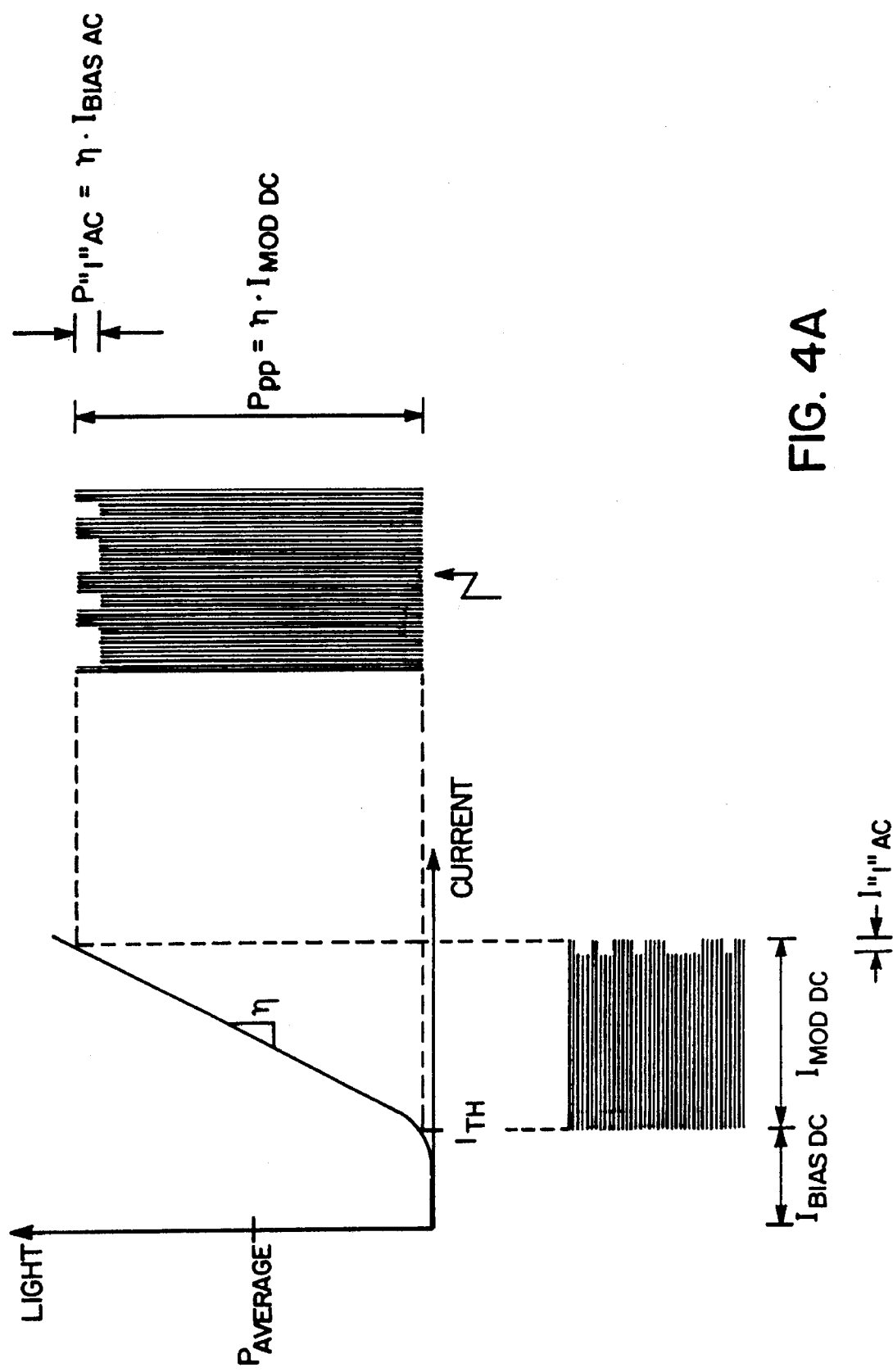
FIG. 4A is a light-current characteristic of a laser diode with '1' level modulation according to a second embodiment of this invention.
Figure 4B:
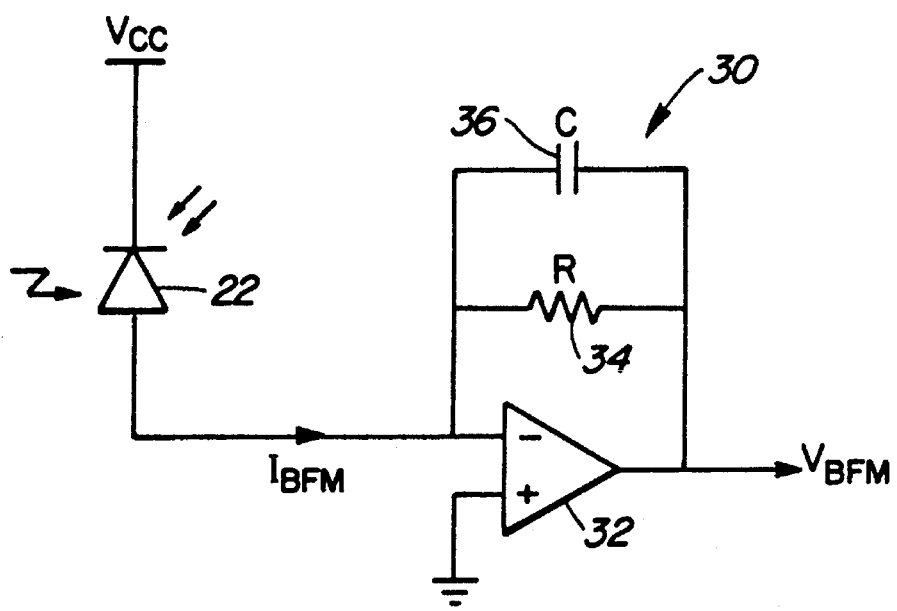
FIG. 4B is a circuit diagram of the back facet monitor and transimpedance amplifier for '1' level modulation.
Figure 4C:
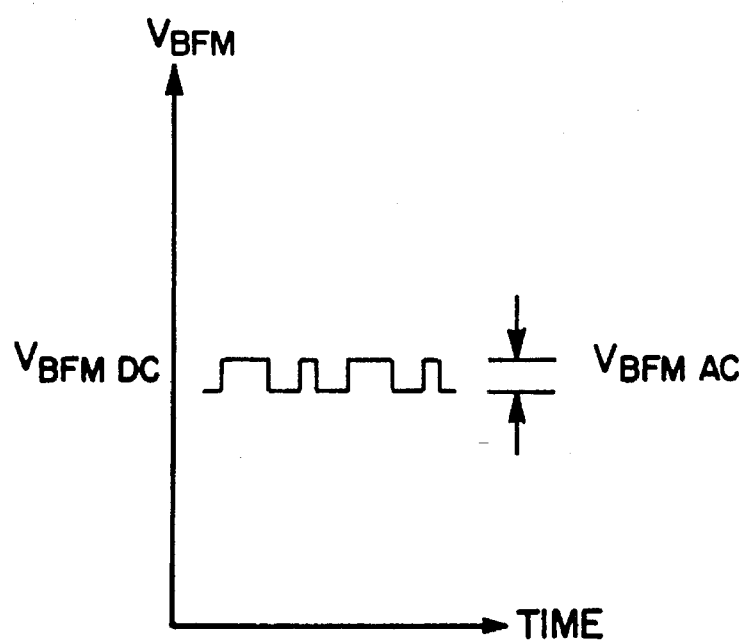
FIG. 4C is a waveform of the voltage output of the transimpedance amplifier of FIG. 4B.

FIG. 4A relates to the algorithm according to a second embodiment which is implemented using '1' level modulation. The light-current curve is the same as represented in FIG. 2A. In this embodiment, however, the low bit rate, pseudo-random sequence is superimposed on the '1' level of the modulation current. As before the peak to peak power is equal to the slope of the light/current characteristic, $\eta$ times the dc modulation current; $I_{mod\,dc}$. The ac component on the '1' level power is equal to $\eta$ times the amplitude of the current of the pseudo-random sequence. FIG. 4B shows the detector 22/amplifier circuit 30 used to convert the output current from the detector to the back facet monitor voltage $V_{BFM}$. FIG. 4C shows the waveform for $V_{BFM}$ ac as a function of time. This signal is detected with a correlator and the output compared with a reference and the result is used to set current levels through the laser diode as previously discussed.

The product of the correlator output COR (which is a measure of $V_{BFM\,ac}$) times the modulation current $I_{mod\,dc}$, is directly proportional to the peak-to-peak power, i.e., COR× $I_{mod\,dc} \propto P_{pp}$. Since the digital controller can determine the modulation current, $I_{mod\,dc}$, the product COR×$I_{mod\,dc}$ can be compared with a reference and the difference used to set the modulation current $I_{mod\,dc}$.

The scheme for this embodiment is appropriate for laser diodes which should be biased well above threshold since it does not require threshold sensing.

Figure 5A:
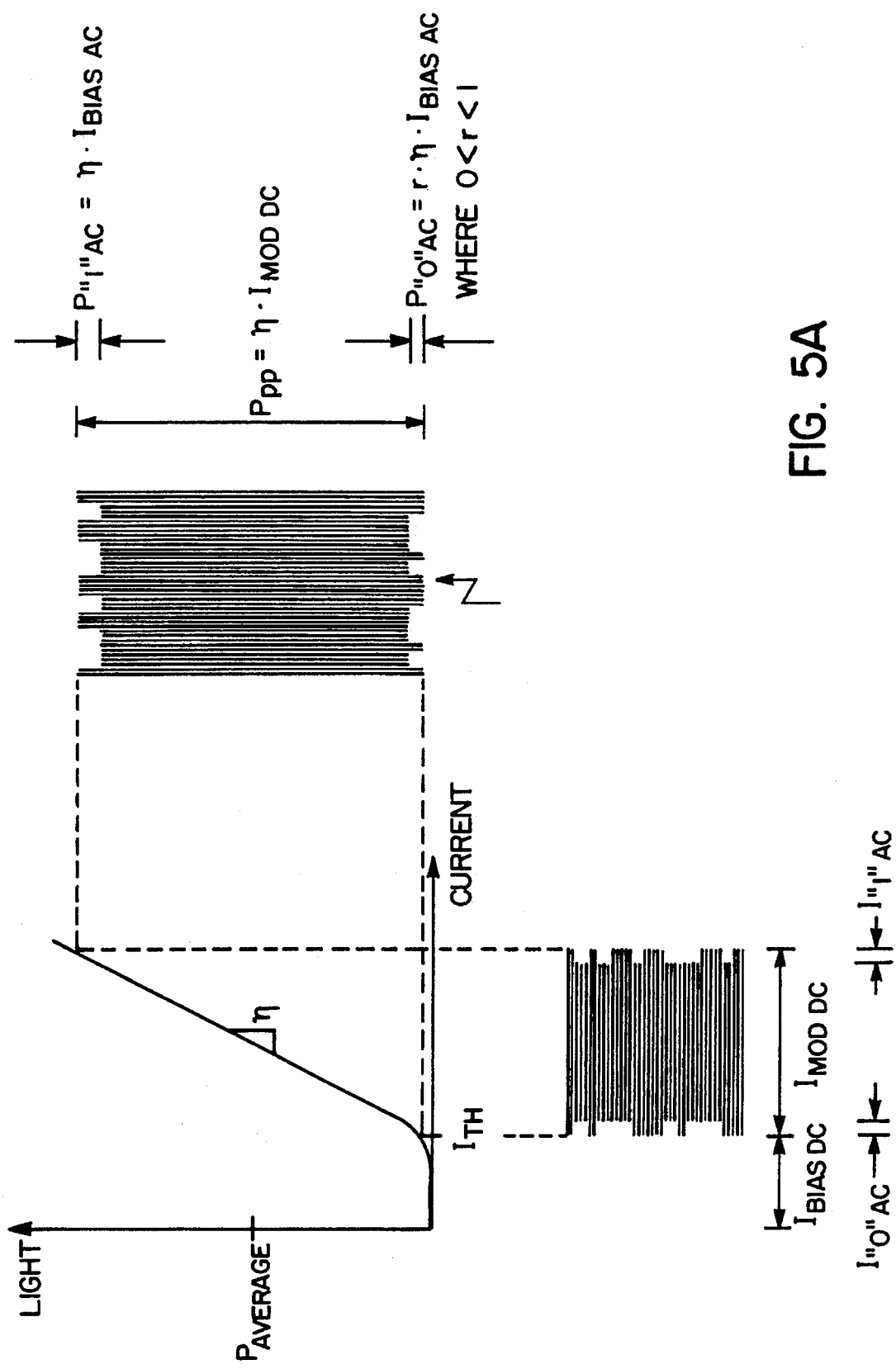
FIG. 5A is a light-current characteristic of a laser diode with '1' and '0' level modulation according to a third embodiment of the invention.
Figure 5B:
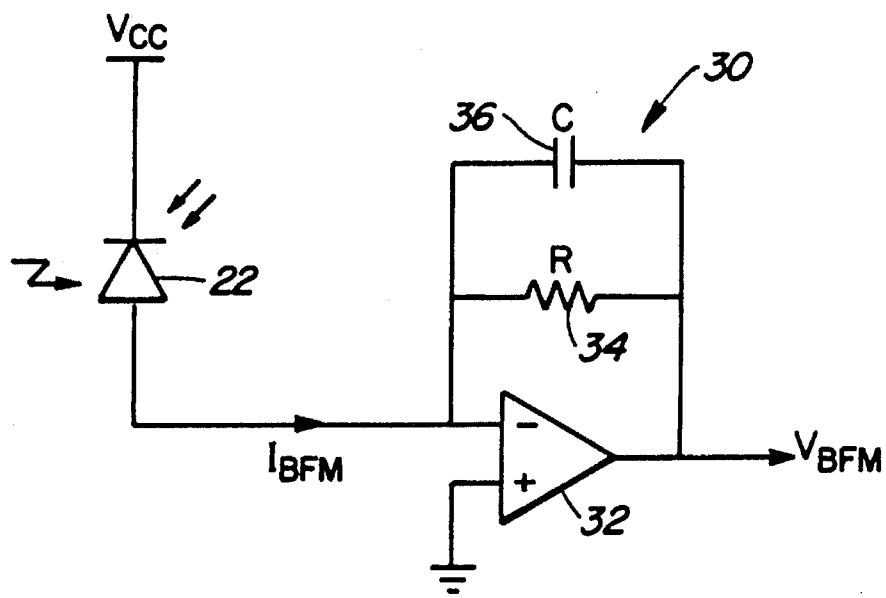
FIG. 5B is a circuit diagram of the back facet monitor and transimpedance amplifier for '1' and '0' level modulation.
Figure 5C:
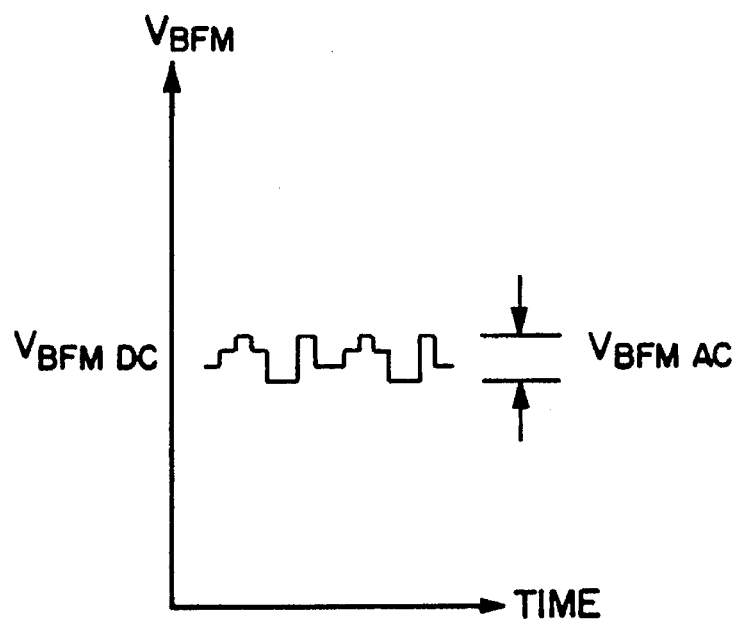
FIG. 5C is a waveform of the voltage output of the amplifier of FIG. 5B.

A third embodiment of the invention is illustrated in FIGS. 5A to 5C in which both the '0' and '1' current levels are modulated. Orthogonal pseudo-random sequences are used to modulate the two current levels as indicated in FIG. 5A. The '0' level sequences $I_{\cdot 0'ac}$ superimposed on the '0' level current results in a power output signal $P_{\cdot 0'ac}$ which is equal to the ac bias current times the slope times a factor r which has a value between 0 and 1, i.e., $$P_{\cdot 0'ac} = r \cdot \eta \cdot I_{bias\,ac}$$

The '1' level sequence $I_{\cdot 1'ac}$ superimposed on the '1' level current results in power output $P_{\cdot 1'ac}$ equal to $I_{\cdot 1'ac}$ times the slope $\eta$. The peak-to-peak power, $P_{pp}$, is equal to $I_{mod\,dc}$ times the slope $\eta$.

The output power having the superimposed orthogonal pseudo random sequence as shown in FIG. 5A is detected by the photodetector 22 and amplified by the RC/amplifier network 30 shown in FIG. 5B. As previously discussed the RC time constant of the resistor 34, capacitor 36 network is much greater than the bit period of the data traffic and much less than the bit period of the orthogonal pseudo random sequence. The $V_{BFM\,ac}$ waveform out of the amplifier network is shown in FIG. 5C. In this embodiment, if two orthogonal pseudo random sequences are used to modulate the '0' and '1' current levels then the radio r given by the equation $$r = \frac{P_{\cdot 0'ac}}{P_{\cdot 1'ac}}$$

can be extracted from the $V_{BFM}$ signal.

The value of r can then be compared with a reference (e.g., $REF_r = 0.5$) and the difference used to set the modulation current, $I_{mod\,dc}$.

Figure 6:
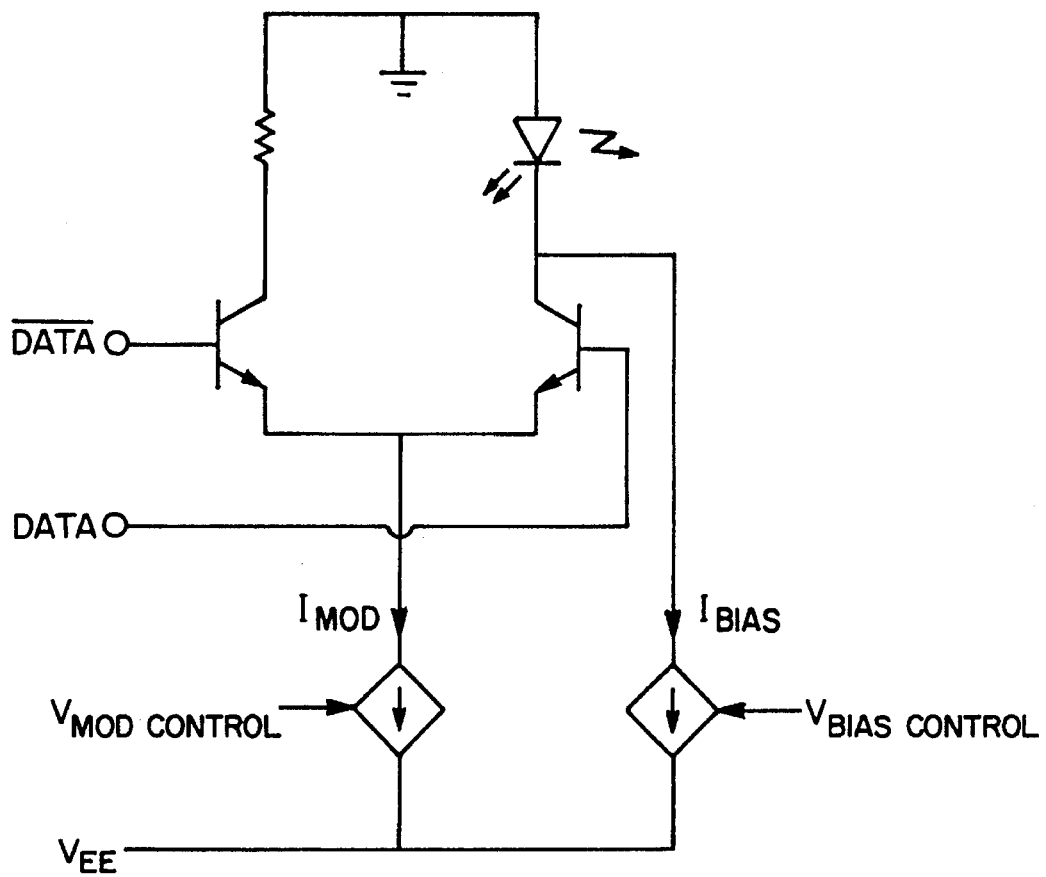
FIG. 6 is a circuit diagram of the laser driver of the invention.

FIG. 6 illustrates a laser driver circuit which can be used to implement the power control schemes according to the present invention. This circuit demonstrates how the precise voltage controlled current sources required to implement the three algorithms can be made with discrete components.

Figure 7:
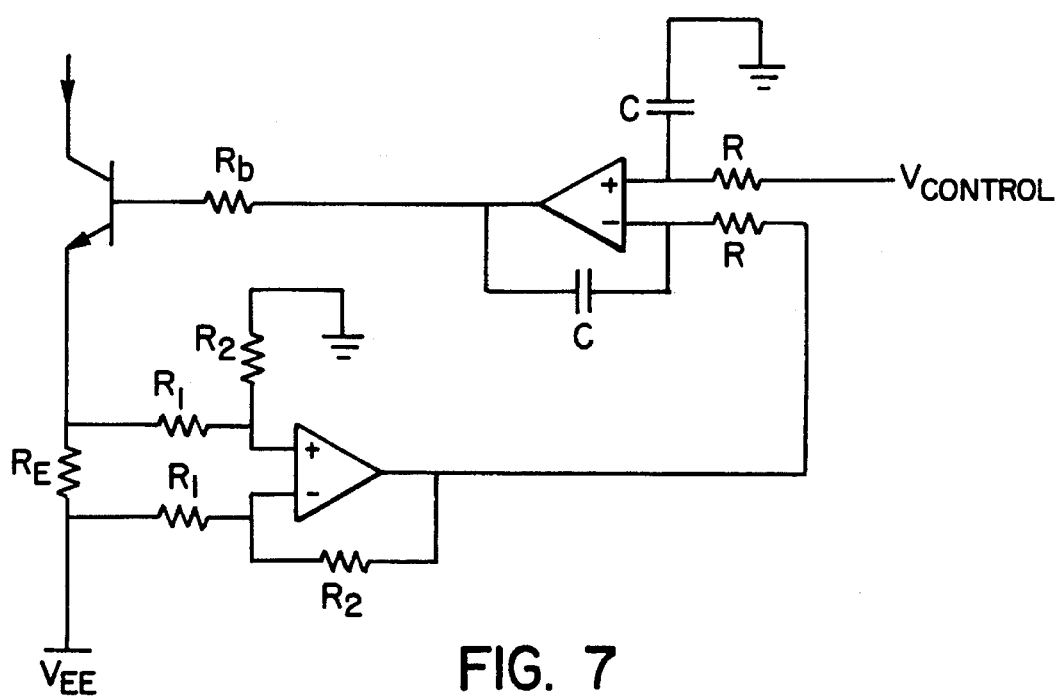
FIG. 7 is a circuit diagram of a voltage controlled current source of the invention.

FIG. 7 is a circuit diagram of a voltage controlled current source applicable to the bias current control.

Figure 8:
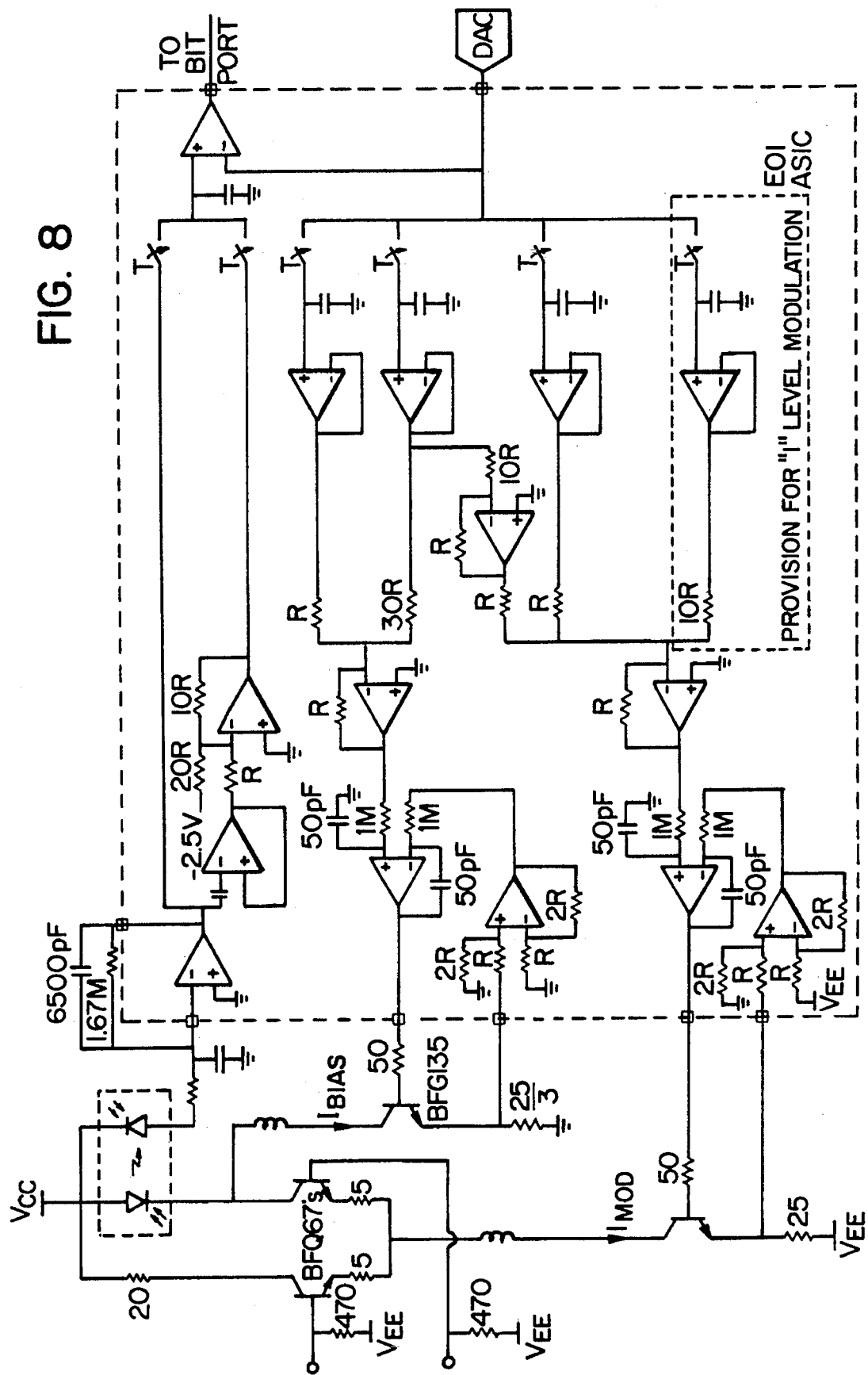
FIG. 8 is a circuit diagram of the controller of the invention integrated into an ASIC.

FIG. 8 is a schematic diagram of circuit including supporting circuitry to implement the algorithms of the present invention. The circuit can be integrated into an Application Specific Integrated Circuit (ASIC) as indicated in FIG. 8. Since resistor ratios can be controlled very accurately on an ASIC the precision by which the different ac and dc currents can be supplied to the digital controller is improved.

The present invention allows a common platform to be used for the digital controller, with provision for selecting the algorithm best suited for the specific application or to accommodate particular characteristics of the laser diode involved.

Although particular embodiments have been illustrated and disclosed it will be apparent to one skilled in the art that alternatives or variations can be employed. It is to be understood, however, that such variations or alterations come within the scope of the present invention as defined by the appended claims.

We claim:

1. An apparatus for controlling the average and peak optical power of an injection laser in order to compensate for temperature and aging effects, said apparatus comprising:

a first voltage controlled current source for applying a bias current to said injection laser;

a second voltage controlled current source for applying a modulating current to said laser, said second current source being modulated by a high frequency differential input to modulate the optical output of the laser;

a digital drive means associated with said second voltage controlled current source to apply a low frequency pseudo-random sequence to said modulating current, the bit rate and amplitude of said pseudo-random sequence being substantially lower than the amplitude and bit rate of the modulating current;

a photodetector located adjacent a back facet of said laser to detect a representative optical output of said laser and to provide an electrical signal corresponding to said optical output;

a processing circuit including a microprocessor to compare the peak and average output as detected by said back facet monitor with reference signals in a control algorithm in said microprocessor and to generate feedback signals; and a first feedback loop from said processing circuit to said first voltage controlled current source to control said average optical output of said laser, and a second feedback loop from said processing circuit to said second voltage controlled current source to control the peak optical output of said laser.

2. An apparatus as defined in claim 1, said low frequency pseudo-random sequence having an amplitude substantially equal to 1% of the modulating current.

3. An apparatus as defined in claim 2, said low frequency pseudo-random sequence having a big rate of 1 Kb/s.

4. An apparatus as defined in claim 1, said low frequency pseudo-random sequence being applied to the low end of the modulating current.

5. An apparatus as defined in claim 1, said low frequency pseudo-random sequence being applied to the high end of the modulating current.

6. An apparatus as defined in claim 1, said pseudo-random sequence being orthogonal and applied to both the low end and the high end of the modulating current.

7. An apparatus as defined in claim 1, said control algorithm being changeable to provide control of lasers having different characteristics.

8. An apparatus as defined in claim 7, said reference signal used to control said second drive means being based on characteristics of said laser diode at initial start up.

* * * * *